United States Statutory Invention Registration [19]

[11] Reg. Number: H742

Bobbs et al. [43] Published: Feb. 6, 1990

[54] TWO-LINE PHASE-MATCHED RAMAN AMPLIFIER

[75] Inventors: Bradley L. Bobbs, Granada Hills; Jeffrey A. Goldstone, Newbury Park, both of Calif.

[73] Assignee: The United States of America as represented by the Secretary of the Air Force, Washington, D.C.

[21] Appl. No.: 286,029

[22] Filed: Dec. 14, 1988

[51] Int. Cl.[4] ..... H01S 3/00; H03F 7/00

[52] U.S. Cl. ..... 330/4.3; 307/426; 372/3

[58] Field of Search ..... 330/4.3

[56] References Cited

U.S. PATENT DOCUMENTS

| | | | |
|---|---|---|---|
| 3,483,486 | 12/1969 | Sorokin | 331/94.5 |
| 3,881,115 | 4/1975 | Hodgson et al. | 307/88.3 |
| 4,048,516 | 9/1977 | Ammann | 307/88.6 |
| 4,165,469 | 8/1979 | Ammann | 307/426 |
| 4,245,171 | 1/1981 | Rabinowitz et al. | 307/426 |
| 4,277,760 | 7/1981 | Eckbreth | 331/94.5 |
| 4,361,770 | 11/1982 | Rabinowitz et al. | 307/426 |
| 4,498,051 | 2/1985 | Hunter et al. | 330/4.3 |

OTHER PUBLICATIONS

"Angle-Tuned Phase Matching in a Raman Amplifier," Bobbs et al, 1987.

"Angular Compensation for Two-Line Dispersion in a Raman Amplifier", Goldstone et al, 1987.

*Primary Examiner*—Thomas H. Tarcza
*Assistant Examiner*—Linda J. Wallace
*Attorney, Agent, or Firm*—Bernard E. Franz; Donald J. Singer

[57] ABSTRACT

To provide a solution of the problem of medium dispersion in a two-line Raman amplifier which may increase the intensity-length product requirement and limit the conversion efficiency. By adjusting the angles between the input beams, the four-wave mixing phase mismatch due to medium dispersion may be eliminated. This couples together the Raman gains of the two lines so that the effective pump intensity for each is the total pump intensity. Since both lines convert in about the same amplifier length, independent of the relative power in each, the conversion efficiency is not limited by the inability to optimize the length for both lines simultaneously.

5 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

TWO-LINE PHASE-MATCHED RAMAN AMPLIFIER

RIGHTS OF THE GOVERNMENT

The invention described herein may be manufactured and used by or for the Government of the United States for all governmental purposes without the payment of any royalty.

BACKGROUND OF THE INVENTION

The present invention relates to a two-line phase-matched Raman amplifier.

There is a need for sources of high power, high beam quality, coherent radiation throughout the ultraviolet, visible, and infrared spectra for applications in strategic and tactical weaponry, isotope separation, communications, spectroscopy, photochemistry, plasma diagnostics, ets. In cases where high power lasers cannot provide the desired wavelength and beam quality for a particular application, stimulated Raman scattering of the laser radiation has often been used to change the wavelength and radiation to the needed values. A great variety of Raman devices for accomplishing this have been described in review papers, e.g., "Stimulated Raman scattering of laser radiation with a wide angular spectrum," by Yu. E. D'yakov and S. Yu. Nitikin in the *Soviet Journal of Quantum Electronics*, v.17, p. 1227–1247 (1987). "High Power tunable IR Raman lasers," by A. Z. Grasiuk and I. G. Zubarev, in *Applied Physics* V.17, pp.211–232 (1978), and "Raman lasers," by A. Z. Grasyuk, in the *Soviet Journal of Quantum Electronics*, v.4, p.269–282 (1974). Particular problems may occur with these previous approaches, however, when the laser has two strong spectral lines, e.g., a high temperature XeF excimer laser. Some of these problems have been described in "Two-line coupling beam quality effects in stimulated Raman scattering," by R. B. Holmes and A. Flusberg, in the *Proceedings of the Society of Photooptical Instrumentation Engineers* v. 642, pp.143–148 (1986).

In a Raman amplifier with a two-line pump laser, dispersion in the Raman medium may decouple the Raman gains from each other. The small signal gain of each line is then reduced by the fraction of the total pump power in each line. If these gains are very different from each other, then the overall conversion efficiency to the Stokes-shifted output may be limited by the difficulty in optimizing the amplifier cell length for both lines simultaneously. Incomplete coupling can lead to wavefront aberrations through interaction with self-focusing induced by a transient refractive index in the medium.

United States patents of interest include U.S. Pat. No. 4,165,469 to Ammann, which discloses a Raman crystal which produces second harmonics and sum frequencies of the pump and Stokes lines. By rotating the crystal to change the angle it forms with the pump beam it is possible in the patented construction to phase match the second harmonics and sum frequencies. Eckbreth, in U.S. Pat. No. 4,277,760, generates coherent anti-Stokes Raman radiation where three input beams are focused to produce three-wave mixing. The angular separation between the beams is controlled to phase match the beams. Two of the beams in the Eckbreth Patent are pump beams and the third is a Stokes beam. In U.S. Pat. No. 4,361,770 Rabinowitz et al discuss the four wave mixing that occurs in a Raman device involving two pump beams and two Stokes beams. In U.S. Pat. No. 3,881,115, Hodgson et al describe a double quantum laser employing a combination of Raman emission and four-wave parametric conversion. In U.S. Pat. No. 4,498,051, Hunter et al discuss pumping a krypton fluoride lasing media.

SUMMARY OF THE INVENTION

An object of the invention is to provide a solution of the problem of medium dispersion in a two-line Raman amplifier which may increase the intensity-length product requirement and limit the conversion efficiency.

According to the invention, by adjusting the angles between the input beams, the four-wave mixing phase mismatch due to medium dispersion may be eliminated. This couples together the Raman gains of the two lines so that the effective pump intensity for each is the total pump intensity. Since both lines convert in about the same amplifer length, independent of the relative power in each, the conversion efficiency is not limited by the inability to optimize the length for both lines simultaneously.

DETAILED DESCRIPTION

Figure 1:
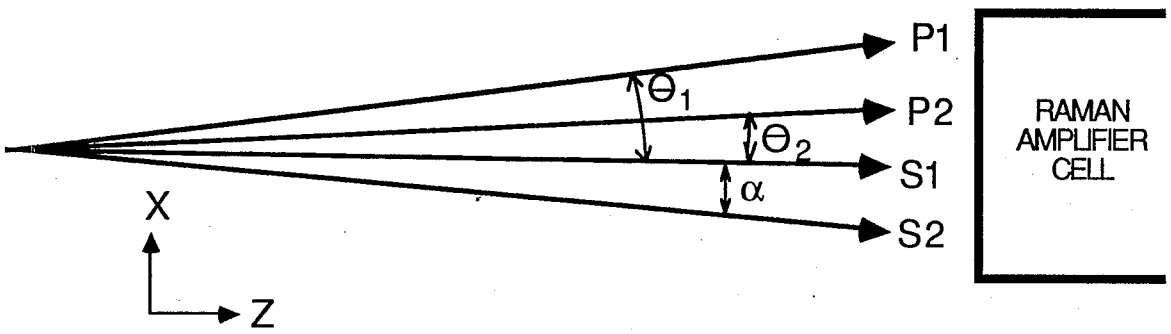
FIG. 1 is a vector diagram showing the propagation vectors for two pump spectral lines P1 and P2, and for their corresponding Stokes-shifted seed spectral lines S1 and S2.

Material relating to the invention has peen presented at a classified conference and at an unclassified conference and papers by Bradley Bobbs, J. A. Goldstone, and Michael M. Johnson are being published in both conference proceedings. The paper (unclassified) presented on Mar. 2, 1987 at the classified AIAA/SDID High Power Laser Conference is titled "Angle-Tuned Phase Matching in a Raman Amplifier"; and the paper presented on Jan. 11, 1988 at the SPIE O-E/LASE Symposium at Los Angeles, Calif., is titled "Anglular Compensation for Two-Line Dispersion in a Raman Amplifier". Copies of the two papers are included with this application as filed and are hereby incorporated by reference.

INTRODUCTION

When the pump laser for a Raman amplifier has two spectral lines, the Raman gains of the two lines in the Stokes-shifted output may be coupled together by a four-wave mixing process. However, a phase mismatch in this process can cause partial or complete decoupling of the lines. In a colinear geometry, where all beams are parallel and overlapping, dispersion of the Raman medium may produce a sufficiently large mismatch. An example of this occurs in a vibrational $H_2$ amplifier pumped by a hot XeF laser with lines at 351 nm and 353 nm. The phase mismatch may be reduced or eliminated by tuning the angles between the input beams slightly away from zero so as to compensate for medium dispersion. Since the angles required are small (in the milliradian range), overlap between the beams within the Raman cell is generally not severely reduced. A number of advantages may be realized by this configuration.

One advantage of phase-matching is the resulting increase in gain. The small-signal gain will be proportional to the total pump intensity in both lines, rather than just the fraction of intensity in each line. The requirement on the pump intensity-cell length product (IL) is thus reduced. The beam Fresnel number may then be increased, reducing deleterious diffraction effects. The length may be shortened, improving system compactness and reducing medium inhomogeneity effects, or the beam area may be enlarged, decreasing the possibility of window damage.

A second advantage applies when the power split between the lines is unequal. Conversion of the two lines at different IL values results in a narrow IL range for efficient first Stokes conversion. This range may be too narrow to accommodate spatial and temporal pump intensity variations, so that overall efficiency is reduced. Furthermore, selection of an optimum cell length L can be difficult if the power split is unknown or time-dependent. Gain-coupling causes both lines to convert at nearly the same IL value, resulting in a wider high-efficiency range. This range is independent of the power split, so that an optimum cell length is readily found.

A third advantage is realized under conditions of partial decoupling in a medium with a large polarizability difference between its ground and excited states. These conditions occur in the above-mentioned example for $H_2$ densities up to several amagats. Diffractively enhanced intensity variations then produce a nonuniform polarizability which can significantly aberrate the output beam, even if only a minute fraction of the medium is excited. This effect is greatly exacerbated by incomplete coupling between the gains of two lines. In this case the gains have a varying phase between them, so that they add to create a Stokes beam shift which is highly sensitive to intensity variations. In the phase-matched case, on the other hand, the fully coupled gains are phase-locked together so that no such phase shift is produced. Marked improvements in the Stokes output wavefront are possible.

Shown in FIG. 1 are the propagation vectors for the two pump beams P1 and P2, and for their corresponding Stokes-shifted seed beams S1 and S2. The four-wave mixing phase-matching condition is given by the vector equation $$\bar{K}P1-\bar{K}P2-\bar{K}S1+\bar{K}S2=0$$

for the conservation of photon momemtum. This condition is satisfied when all angles are zero only in the limit of zero medium dispersion or zero frequency difference between beams P1 and P2. However, for some cases of practical interest, e.g., an XeF pump laser with lines at 351 nm and 353 nm converted by the $H_2$ vibrational process, nonzero angles are required. The angle $\alpha$ between the seed beams and hence the Stokes output beams is an example of the spectral fanning effect, and in general cannot be reduced to zero. The minimum value of $\alpha$ is found for the case $\theta_1=\theta_2$. This case may, however, be undesirable because of the large value of $\theta_1$ required, on the order of several milliradians, which may reduce beam overlap within the Raman cell excessively. Other solutions with larger $\alpha$ but with much smaller $\theta$'s exist for $\theta_1 \neq \theta_2$.

For maximum gain, the phases of the input fields should satisfy $\Delta\phi=0$. where $$\Delta\phi=\phi_{P1}-\phi_{P2}-\phi_{S1}-\phi_{S2}.$$

Minimum gain (possibly zero gain) occurs for $\Delta\phi=\pi$.

The amplifier input requirements are greatly simplified if only one of the Stokes lines is seeded. Four-wave mixing will then generate the other seed automatically with the proper direction and phase for maximum gain.

Figure 2:
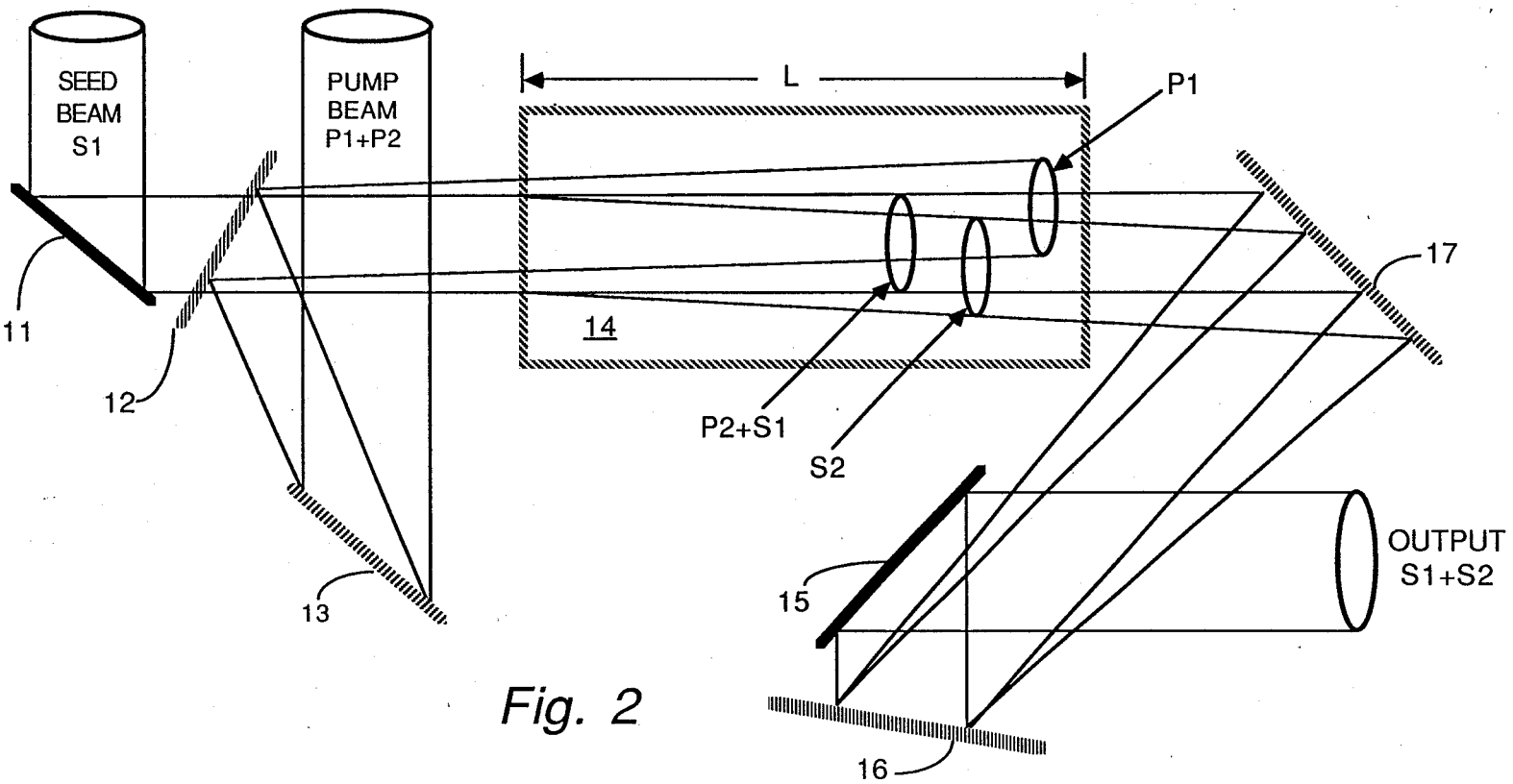
FIG. 2 is a symbolic diagram showing apparatus for using the invention.

FIG. 2 illustrates the apparatus needed to amplify a seed beam by a two-pump beam using a phase matched Raman amplifier. The four spectral lines involved are denoted by P1, P2, SI, and S2 in order of increasing wavelength. For an example case where the pump laser uses hot XeF and the Raman medium is room temperature hydrogen at 3.5 atm pressure, the four wavelengths would be 351 nm, 353 nm, 411 nm, and 414 nm, respectively. The input pump beam comes from a laser (not shown) which supplies the power for the amplifier, and contains both P1 and P2 spectral lines. The input seed beam comes from a weaker laser (not shown), or from a Raman generator cell (not shown), using the usual apparatus and techniques. If the seed beam contains both Stokes-shifted spectral lines S1 and S2, the Raman amplification may be sensitive to extremely small optical path differences due to interference effects between lines. These effects may be avoided by spectrally separating the two lines and dumping the weaker one. For the case shown in FIG. 2, only the S1 line is present in the seed beam.

The pump beam reflects off a reflection grating 13 (or passes through a transmission grating or prism) to introduce an angular separation between the P1 and P2 lines as specified by the phase matching condition. The appropriate grating line spacing and orientation are readily calculated by standard techniques. The pump beam is then directed towards the Raman cell 14 by a dichroic beamsplitter 12 which reflects beams P1 and P2 but transmits beams S1 and S2. A folding mirror 11 (or another grating if the seed beam contains both S1 and S2 lines) directs the seed beam through the dichroic beamsplitter 12 and into the Raman cell 14, with an angle relative to the P1 and P2 beams as specified by the phase matching condition. In the maximal-overlap phase matching solution used in FIG. 2, the P2 and S1 lines propagate collinearly, i.e. parallel. The S2 line will be generated by four-wave mixing in the Raman amplifier cell 14. This cell is the same design as for usual collinear designs having all beams parallel. The required cell length L for efficient conversion is calculated as usual, but under the assumption that the pump beam is monochromatic. The length L is independent of the fractional power split between the two pump lines, and is shorter than that required for a two-line collinear geometry by a factor as large as 2.0. Two reflection gratings 17 and 16 (or transmission gratings or prisms) remove the angle and transverse displacement between the two Stokes lines which exit the Raman cell. Again, the appropriate grating line spacings and orientations are readily calculated by standard techniques. A single grating would be adequate if the displacement between lines S1 and S2 is negligible. A final folding mirror 15 directs the output in the desired direction.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A method for a Raman amplifier having a pump laser with two spectral lines used as input beams, and a Raman medium in which Raman gains of two lines in Stokes-shifted output are coupled together by a four-wave mixing process, said method comprising adjusting the angles between the input beams, so that the four-wave mixing phase mismatch due to medium dispersion is substantially eliminated;

whereby the Raman gains of the two Stokes shifted lines are coupled together so that the effective pump intensity for each is the total pump intensity: and since both lines convert in about the same amplifer length, independent of the relative power in each, the conversion efficiency is not limited by the inability to optimize the length for both lines simultaneously.

2. The method according to claim 1, wherein a Raman amplifier is used to transfer energy from a pump laser having two spectral lines with poor beam quality into a Stokes beam having two spectral lines of good quality, thereby creating a beam cleanup device.

3. The method according to claim 1, wherein a Raman amplifier is used to transfer the energy from a pump laser having two spectral lines into a Stokes beam of shifted frequency, said frequency being either lower than the pump laser frequency (Stokes) or higher than the pump laser frequency (anti-Stokes) thereby creating a frequency shifting device.

4. The method according to claim 1, wherein a Raman amplifier is used to transfer the energy from a pump laser having two spectral lines into a Stokes beam of shifted frequency, said Stokes beam being generated from a small seed beam which has a desired wavefront impressed upon it by a linear or nonlinear adaptive optic in order to provide Raman lookthrough device.

5. The method according to claim 1, wherein a Raman amplifier is used to transfer the energy from two coherent pump lasers into a Stokes beam of shifted frequency, thereby creating a beam combining device.

* * * * *